(12) United States Patent
Patel et al.

(10) Patent No.: US 7,082,778 B2
(45) Date of Patent: Aug. 1, 2006

(54) SELF-CONTAINED SPRAY COOLING MODULE

(75) Inventors: Chandrakant D. Patel, Fremont, CA (US); Cullen E. Bash, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 331 days.

(21) Appl. No.: 10/656,588

(22) Filed: Sep. 4, 2003

(65) Prior Publication Data

US 2004/0040328 A1 Mar. 4, 2004

Related U.S. Application Data

(63) Continuation-in-part of application No. 09/945,046, filed on Aug. 31, 2001, now Pat. No. 6,708,515.

(60) Provisional application No. 60/271,277, filed on Feb. 22, 2001.

(51) Int. Cl.
*F25D 23/12* (2006.01)

(52) U.S. Cl. ............... 62/259.2; 62/3.2; 62/118; 165/80.4

(58) Field of Classification Search ............... 62/118, 62/132, 259.2, 64, 171, 3.2, 3.3; 165/104.33, 165/80.4; 361/699
See application file for complete search history.

(56) References Cited

U.S. PATENT DOCUMENTS

| | | | |
|---|---|---|---|
| 2,643,282 A | 6/1953 | Greene | 174/15 |
| 2,849,523 A | 8/1958 | Narbut | 174/15 |
| 2,858,355 A | 10/1958 | Narbut | 174/15 |
| 2,875,263 A | 2/1959 | Narbut | 174/15 |
| 4,141,224 A | 2/1979 | Alger et al. | 62/514 R |
| 4,290,274 A | 9/1981 | Essex | 62/157 |
| 4,352,392 A | 10/1982 | Eastman | 165/104.25 |
| 4,490,728 A | 12/1984 | Vaught et al. | 346/1.1 |
| 4,500,895 A | 2/1985 | Buck et al. | 346/140 R |
| 4,559,789 A | 12/1985 | Riek | 62/157 |
| 4,576,012 A | 3/1986 | Luzenberg | 62/157 |

(Continued)

OTHER PUBLICATIONS

Sehmbey, M.S., Pais, M.R. and Chow, L.C., "Effect of Surface Material Properties and Surface Characteristics in Evaporative Spray Cooling," The Journal of Thermophysics & Heat Transfer, Jul.-Sep. 1992, vol. 6, No. 3, pp. 505-511.

(Continued)

*Primary Examiner*—Melvin Jones

(57) ABSTRACT

A semiconductor chip cooling system having a body that forms an enclosed spray chamber, and having a thermal-transmittance wall configured to conformingly adjoin to a chip, a substrate or printed circuit board carrying one or more chips, or another such heated device. Inkjet-type sprayers are configured to spray cooling fluid on the thermal-transmittance wall to cool the chip. A controller transmits a control signal to the sprayer to cause the sprayer to spray at a rate leading to the cooling fluid being vaporized by the semiconductor device without the device either drying or becoming covered by a pool. The cooling system uses cooling fluid surface tension forces to draw liquid cooling fluid up a porous member from the spray chamber back to the sprayers, to be sprayed again. The cooling system uses gravity and/or pressure within the spray chamber to direct vaporized cooling fluid upward from the spray chamber to a condenser. The condenser is configured to cool and condense the vapor. A reservoir is positioned below the condenser and above the sprayers so as to receive condensed vapor from the condenser and feed it to the sprayers.

34 Claims, 5 Drawing Sheets

U.S. PATENT DOCUMENTS

| | | | |
|---|---|---|---|
| 4,683,481 A | 7/1987 | Johnson | 346/140 R |
| 4,685,308 A | 8/1987 | Welker et al. | 62/171 |
| 4,794,410 A | 12/1988 | Taub et al. | 346/140 R |
| 5,212,975 A | 5/1993 | Ginzburg | 72/43 |
| 5,220,804 A | 6/1993 | Tilton et al. | 62/64 |
| 5,247,426 A | 9/1993 | Hamburgen et al. | 361/705 |
| 5,278,584 A | 1/1994 | Keefe et al. | 346/140 R |
| 5,434,606 A | 7/1995 | Hindagolla et al. | 347/45 |
| 5,718,117 A | 2/1998 | McDunn et al. | 62/64 |
| 5,724,824 A | 3/1998 | Parsons | 62/171 |
| 5,731,542 A * | 3/1998 | Limper-Brenner et al. | 174/52.4 |
| 5,768,103 A * | 6/1998 | Kobrinetz et al. | 361/699 |
| 5,797,274 A | 8/1998 | Jackaman et al. | 62/171 |
| 5,907,473 A | 5/1999 | Przilas et al. | 361/699 |
| 5,924,198 A | 7/1999 | Swanson et al. | 29/890.1 |
| 5,943,211 A | 8/1999 | Havey et al. | 361/699 |
| 5,992,159 A | 11/1999 | Edwards et al. | 62/64 |
| 6,108,201 A | 8/2000 | Tilton et al. | 361/689 |
| 6,182,742 B1 | 2/2001 | Takahashi et al. | 165/104.33 |
| 6,205,799 B1 | 3/2001 | Patel et al. | 62/132 |
| 6,484,521 B1 | 11/2002 | Patel et al. | 62/171 |
| 6,550,263 B1 | 4/2003 | Patel et al. | 62/259.2 |
| 6,612,120 B1 | 9/2003 | Patel et al. | 62/171 |

OTHER PUBLICATIONS

Pais, Martin R., Chang, Ming J., Morgan, Michael J. and Chow, Louis C., Spray Cooling of a High Power Laser Diode, SAE Aerospace Atlanta Conference & Exposition, Dayton, Ohio, 1994, pp. 1-6.

Morgan, Michael J., Chang, Won S., Pais, Martin R. and Chow, Louis C., "Comparison of High Heat-Flux Cooling Applications," SPIE, 1992, vol. 1739, pp. 17-28.

Denney, D. Lawrence, "High Heat Flux Cooling Via a Monodisperse Controllable Spray", A Thesis Presented to The Academic Faculty of Georgia Institute of Technology in Partial Fulfillment of the Requirements for the Degree Master of Science in Mechanical Engineering, Mar. 1996.

Lee, Chin C., and Chien, David H., "Thermal and Package Design of High Power Laser Diodes," IEEE, 1993, Ninth IEEE Semi-Therm Symposium, pp. 75-80.

Sehmbey, Mainder S., Chow, Louis C., Pais, Martin R. and Mahefkey, Tom, "High Heat Flux Spray Cooling of Electronics," American Institute of Physics, Jan. 1995, pp. 903-909.

Mudawar, I. and Estes, K.A., "Optimizing and Predicting CHF in Spray Cooling of a Square Surface," Journal of Heat Transfer, Aug. 1996, vol. 118, pp. 672-679.

* cited by examiner

SELF-CONTAINED SPRAY COOLING MODULE

The present application claims priority from U.S. patent application Ser. No. 09/945,046, filed Aug. 31, 2001 now U.S. Pat. No. 6,708,515, which incorporates by reference, and claims priority from, provisional patent application Ser. No. 60/271,277, filed Feb. 22, 2001, both of which are incorporated herein by reference for all purposes.

The present invention relates generally to cooling systems for hot devices such as semiconductor devices, chips, medical electronics, light emitting diodes, lasers and other optical devices, and more particularly, to a self-contained spray cooling system and related methods to cool one or more of such heat-generating devices.

BACKGROUND OF THE INVENTION

With the advent of semiconductor devices having increasingly large component densities, the removal of heat generated by these devices has become an increasingly challenging technical issue. Moreover, device miniaturization has led device designers to integrate previously separate components, such as the components used to create a cache for a microprocessor, into the microprocessor die. This consolidation of devices has resulted in high CPU core power densities, and extreme power dissipation requirements.

The use of boiling/vaporizing methods with inert cooling fluids provides cooling levels that can meet extreme cooling requirements. While pool boiling (i.e., submerging a chip in cooling fluid) provides significant gains over traditional air cooling, spray cooling (i.e., spraying the chip with cooling fluid) presently provides the highest heat dissipation levels for a heat-generating device such as a semiconductor chip. The best results are obtained when the cooling fluid is uniformly sprayed over each area having a uniform dissipation requirement. The mass flow rate of sprayed cooling fluid should be at a level such that the energy needed to vaporize the sprayed cooling fluid matches the power dissipation requirements of the device.

With reference to FIG. 1, in a single, high-dissipation, spray cooling system, an inert spray cooling fluid from a reservoir 11 is preferably sprayed by a group of one or more sprayers 13 onto an aligned group of one or more chips 15 mounted on a printed circuit board 17. The cooling fluid preferably vaporizes, dissipating heat from within the chip. The sprayers, the chips and the board are mounted within an evacuated and sealed case 19 fixed within a computer system. The sprayed cooling fluid is typically gathered and cooled within a condenser 21, and then routed back to the reservoir by a pump 23. For semiconductor devices, low boiling point fluids such as 3M® FC-72 (FED. CIR.-72, i.e., FLUORINERT®, sold by 3M® Corporation), 3M's Novec line of fluids (HFE 7100, etc., sold by 3M® Corporation) or PF-5060 are among a number of known suitable cooling liquids. These fluids provide vaporization temperatures in appropriate ranges, while not having corrosive effects on the relevant materials, and not conducting electricity to any significant level (i.e., any level that would affect the operation of a submerged chip).

Modern systems using high-dissipation chips frequently have a variety of chips requiring different levels of cooling, only some of which are extreme. Depending on an electronic system's design, components containing these chips can be located throughout the system. Because they have high dissipation requirements, the chips are not easily cooled using conventional air-cooling. Because the chips are spread out, they are not easily cooled by high-dissipation spray cooling systems, which are typically complex systems. Such cooling systems will typically require either the expense of providing separate components for each individual cooling system, or the expense of interconnecting a group of cooling systems to one or more shared components (e.g., shared pumps, condensers and/or reservoirs). Therefore, high-dissipation cooling systems can be expensive and complicated to implement in complex systems having numerous hot components.

The nozzle design is a key component of spray cooling. Pressure assisted and gas assisted nozzles are known designs. However, these types of nozzles are limited in their ability to control the mass flow rate at which they spray. Therefore, they can cause "pooling" (i.e., a buildup of liquid on the cooled device due to excessive spray rates), which decreases spray cooling effectiveness.

Additionally, pressure-assisted spraying requires one or more high pressure pumps that provide a precise pressure to pump the liquid through a nozzle, even at varying flow rates. Both the distribution and the flow rate of the sprayed liquid can change with variations in the driving pressure and/or small variations in the nozzle construction. Thus, the cooling system is a sensitive and potentially expensive device that can be a challenge to control.

Gas-atomized spraying requires the delivery of both cooling fluid and a pressurized gas to a spray head in a precise manner. Because the gas must be pressurized separately from the cooling fluid, such systems are not typically closed systems, which invites contamination. Thus, both types of spray cooling system are sensitive and potentially expensive devices that can be a challenge to control.

Furthermore, spray cooling systems typically include on both active sprayer systems and active condensing systems (i.e., sprayer systems and condensing systems relying on moving parts) to operate. If either system fails, the cooling system likely becomes inoperative, potentially leading to the failure and destruction of the cooled component(s).

Accordingly, there has existed a need for a spray cooling system that can be reliably implemented, both efficiently and cost effectively, in multiple locations within a complex system. Various embodiments of the present invention satisfy these and/or other needs, and provide further related advantages.

SUMMARY OF THE INVENTION

In various embodiments, the present invention solves some or all of the needs mentioned above by providing a modular cooling module that efficiently typically operates on high-dissipation devices.

The invention provides a system for cooling a component with a sprayed cooling fluid, and includes a body defining an enclosed spray chamber, and a sprayer configured to spray the cooling fluid. The invention typically features a thermal-transmittance wall with an internal surface forming a boundary of the spray chamber, and an external surface configured to be retained against a portion of the component. The sprayer is configured to spray onto the internal surface of the thermal-transmittance wall, thereby allowing the cooling fluid to absorb heat from the component, and preferably to vaporize from that heat.

Advantageously, this feature provides for the cooling system to be a modular, self-contained system that is flexible, in that it can be used to cool one or more hot components in a variety of positions and/or orientations.

Because the cooling fluid does not generally come into contact with the component, the cooling system can be used without consideration of how contact from the cooling fluid could affect the component (or vice versa). Furthermore, because the cooling system is modular, it can typically be rapidly attached, removed and/or serviced.

The invention also typically features a sprayer that is configured to eject incremental amounts of cooling fluid onto the wall in response to a control signal, and further features that the sprayer is a thermal sprayer that is controlled by a controller. Advantageously, such sprayers, under the control of a controller with relevant information, can deliver cooling fluid at precise rates that are appropriate to the cooling needs of the components.

Integrated cooling system elements, such as an integrated condenser configured to remove heat from vaporized cooling fluid, an integrated pump configured to pump liquid cooling fluid from the spray chamber, and/or an integrated reservoir configured to feed liquid cooling fluid to an inlet of the sprayer, are also featured on some embodiments of the invention. These integrated elements provide for the cooling system to be used in a variety of apparatus without the apparatus having significant accommodations.

The preferable embodiments of the invention also feature a passive, rather than active, pump. Such a pump operates without moving parts, such as by capillary forces. This can be accomplished by a member defining one or more cavities forming a porous passageway extending upward with respect to gravity, toward the sprayer. The lack of moving parts facilitates a lower power requirement for the cooling system than would otherwise be necessary, and adds to system reliability.

Other features and advantages of the invention will become apparent from the following detailed description of the preferred embodiments, taken in conjunction with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

DETAILED DESCRIPTION OF THE PREFERRED EMBODIMENTS

The invention summarized above and defined by the enumerated claims may be better understood by referring to the following detailed description, which should be read with the accompanying drawings. This detailed description of particular preferred embodiments of the invention, set out below to enable one to build and use particular implementations of the invention, is not intended to limit the enumerated claims, but rather it is intended to provide particular examples thereof.

Evaporative spray cooling promises to be a technology that can provide high performance cooling capabilities. An objective of spray cooling is for a device's wall-temperature to achieve a value close to a cooling fluid's saturation temperature. For example, a vaporization of low boiling point fluid such as 3M® FC-72, having a boiling point of 56° C. can achieve a chip wall temperature close to 70° C. Such a wall temperature might be necessary to keep a device's junction temperature at 85° C. This need of keeping the chip wall temperature at 70° C. stems from the typically irregular distribution of power on a chip. The high power densities, reaching 200 W/cm$^2$, for a 50 W source distributed over 0.5 cm by 0.5 cm, cannot easily be addressed by conventional mechanical interfacing means.

To minimize the installation and operating costs, while maximizing the reliability, it is preferable to use passive systems rather than active ones within a cooling device. The present invention preferably resides in a closed loop, integrated, single chip or multi-chip module-level spray cooling system, preferably comprising thermal-inkjet-type heads, a condenser, a reservoir and a passive cooling fluid pump. The design is preferably a singular assembly that can be attached to the device(s) that need to be spray cooled.

Figure 1:
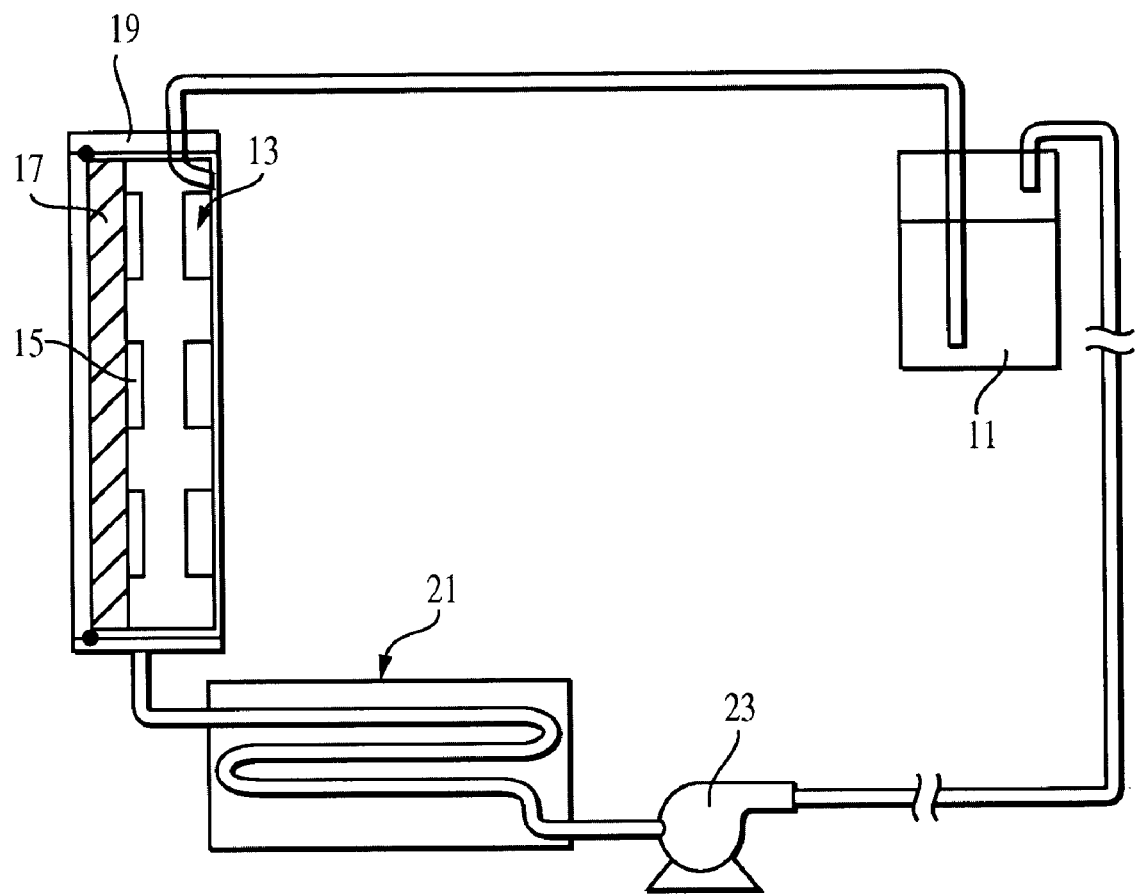
FIG. 1 is a system layout of a prior art spray cooling system.
Figure 2:
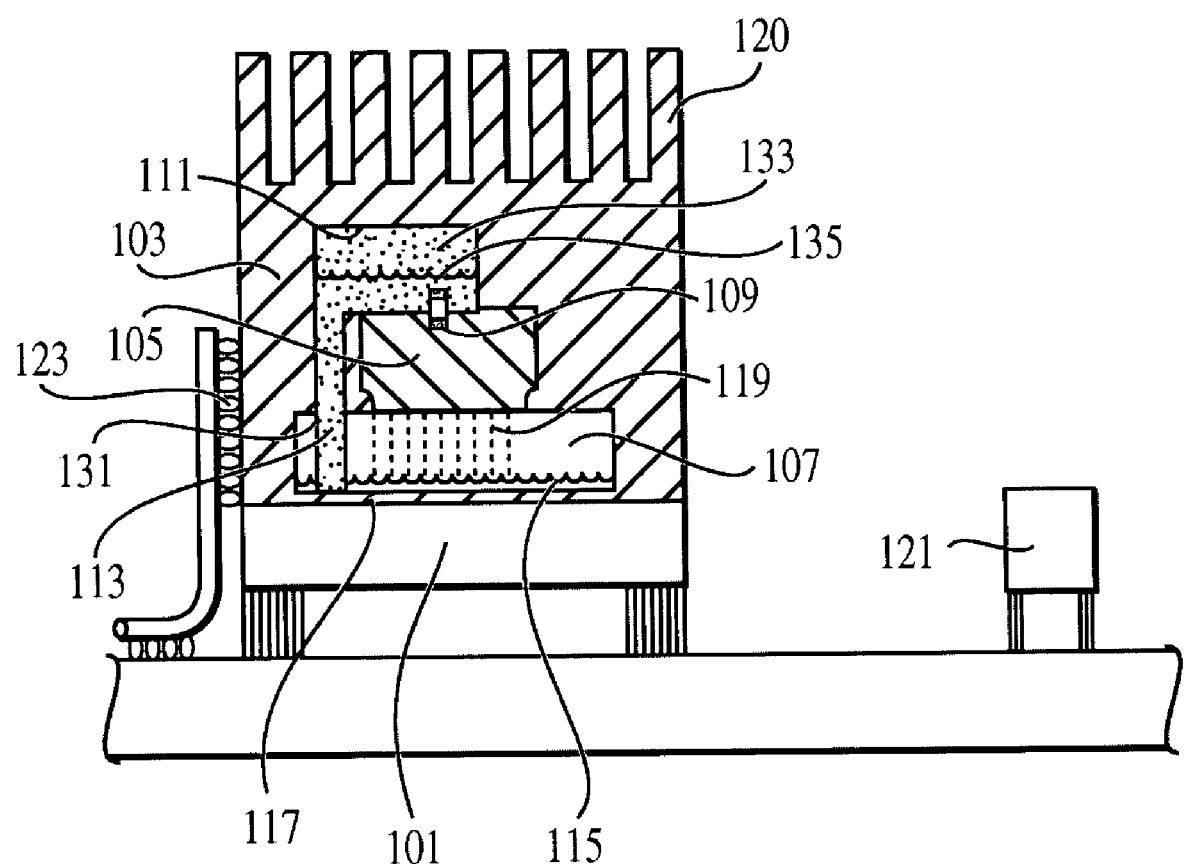
FIG. 2 is a cross-sectional, elevational view of a first embodiment of a cooling system of the invention, configured to cool a component on a printed circuit board.

With reference to FIG. 2, a first embodiment of a cooling system provides for cooling a component including one or more heat-producing devices such as a chip 101 including a heat-generating semiconductor device. The chip may include a cover, or the semiconductor device can be uncovered. The cooling system includes a body forming a cooling cap 103, and one or more sprayers on a sprayer head 105. The cap and sprayer head are preferably integrated into a single cooling assembly. The cap is configured to define a spray chamber 107 in which cooling fluid can be sprayed into thermal communication with the chip. The sprayer head includes a manifold inlet 109 for receiving cooling fluid in a liquid state from a reservoir 111. A member 113 extends from the sprayer head's manifold inlet down to the bottom of the spray chamber with respect to gravity. The member is configured as a passive, capillary-action cooling fluid pump to pump any liquid cooling fluid that has formed a pool 115 in the spray chamber upward to the sprayer head.

More particularly, the spray chamber 107 is preferably enclosed within the cooling cap 103, and preferably forms part of a closed loop cooling system within the cooling cap. To provide for lower vaporization temperatures, open internal portions of the cooling cap, such as the spray chamber, are preferably partially or entirely evacuated of extraneous gasses (i.e., of gasses other than the cooling fluid in a gaseous state). A thermal-transmittance wall 117 (i.e., a wall configured for transmitting heat from the chip to the cooling fluid within the spray chamber) defines the portion of the body through which cooling fluid 119 can come into thermal communication with the chip 101. The cooling fluid is sprayed directly onto an internal, evaporation surface of the thermal-transmittance wall (i.e., a surface that forms a boundary of the spray chamber). An external surface of the thermal-transmittance wall is preferably configured to be conformingly retained against a portion of the chip. Thus, the cooling fluid comes into thermal communication with the chip via the thermal-transmittance wall, and can absorb heat and possibly vaporize due to the heat dissipated by the chip. The heated cooling fluid can vaporize and recondense, or pool in the gravitational bottom of the chamber, which might be coincident with the thermal-transmittance wall.

The thermal-transmittance wall 117 is composed of a material and constructed with a preferably thin thickness such that it provides little thermal resistance for heat dissipated by the chip 101 into the cooling cap 103. Optionally, a thermal connector, such as an interface material of gap-filling thermal foam or other thermally conductive material, can be placed between the thermal-transmittance wall and the chip when then are retained together, thus providing a more thermally conductive interface between the chip and the cooling fluid within the cooling cap.

When the cooling cap 103 conformingly adjoins the semiconductor device or its cover, the internal surface of the spray chamber thermal-transmittance wall 117 is placed in thermal communication with the chip 101. The cooling cap is preferably made of a material having a thermal coefficient of expansion substantially matching that of the adjoining portion of the component (i.e., the semiconductor device or its cover). Preferably, the cap is retained against the component by an adhesive, a clamping mechanism, fasteners, or other attachment-type mechanisms, and the body is configured such that liquid and vapor cooling fluid do not escape the spray chamber other than through designed orifices. The cap forms a package-level cooling system to be affixed to a package and thereby form a cooled package.

As noted, the sprayer head 105 is configured to spray cooling fluid 119 onto the internal surface of the thermal-transmittance wall 117, which heats and preferably vaporizes the cooling fluid to absorb at least some of the heat from the chip. The cooling fluid vapor that forms during the cooling process is retained in the spray chamber 107, dissipating its heat into the walls of the spray chamber (which acts as a part of a condenser 120 configured to remove heat from the vaporized cooling fluid) and then condensing into the pool. The chamber walls in turn dissipate the heat via any of a variety of standard heat sink technologies. If the cap is oriented such that the pool covers the entire internal surface of the thermal-transmittance wall, then pool boiling will generally occur.

For spray cooling systems to function at optimal efficiency, the sprayers' mass flow rate ($\dot{m}_s$) is preferably adjusted to avoid having the semiconductor device become either dry or immersed. This rate is controlled by having a controller adjust the rate that the thermal jets are fired. The optimum mass flow rate can change as the heat flux of the semiconductor device changes. Thus, for a controller to correctly control the mass flow, parameters of the semiconductor device and/or cooling system need to be sensed.

To determine whether the mass flow rate is at an optimal level, sensors can be used to track one or more of the system parameters. The types of parameters that are available vary with the type of system employed. For example, if separate liquid and vapor removal lines are used, the mass flow of the vapor ($\dot{m}_v$) and/or mass flow of the liquid ($\dot{m}_l$) can be sensed. As another example, the vapor pressure within the spray chamber ($P_v$) and the semiconductor device's junction temperature can be sensed. Sensors could be on the cooling cap, the chip, or elsewhere in the system—depending on the required location of the sensors.

Preferably, the sprayers in the sprayer head 105 are incremental sprayers, i.e., they are configured to eject an incremental amount of the cooling fluid, rather than a continuous stream, onto the thermal-transmittance wall. The cooling fluid is typically sprayed in response to an energizing control signal, which is preferably sent to the sprayers by a computerized controller 121. The quantity of liquid sprayed from incremental sprayers can be highly controllable, such as by controlling the rate at which incremental amounts of cooling fluid are ejected, or by controlling the quantity ejected in each increment.

For example, by increasing or decreasing the frequency that the incremental sprayers are energized, the flow rate (i.e., the average rate liquid cooling fluid is ejected) can be accurately adjusted. Furthermore, because the sprayers can be configured to deliver very small quantities of cooling fluid, and because a large number of sprayers can be fit into a small area, the heat distribution over that area can be accurately controlled by energizing some of the sprayers at a rate greater than that of other sprayers. These features provide for accurate delivery of cooling fluid at precise and controllable rates. Another advantage of incremental sprayers is that they can be modular, offering quickly and easily replaceable units.

Figure 3:
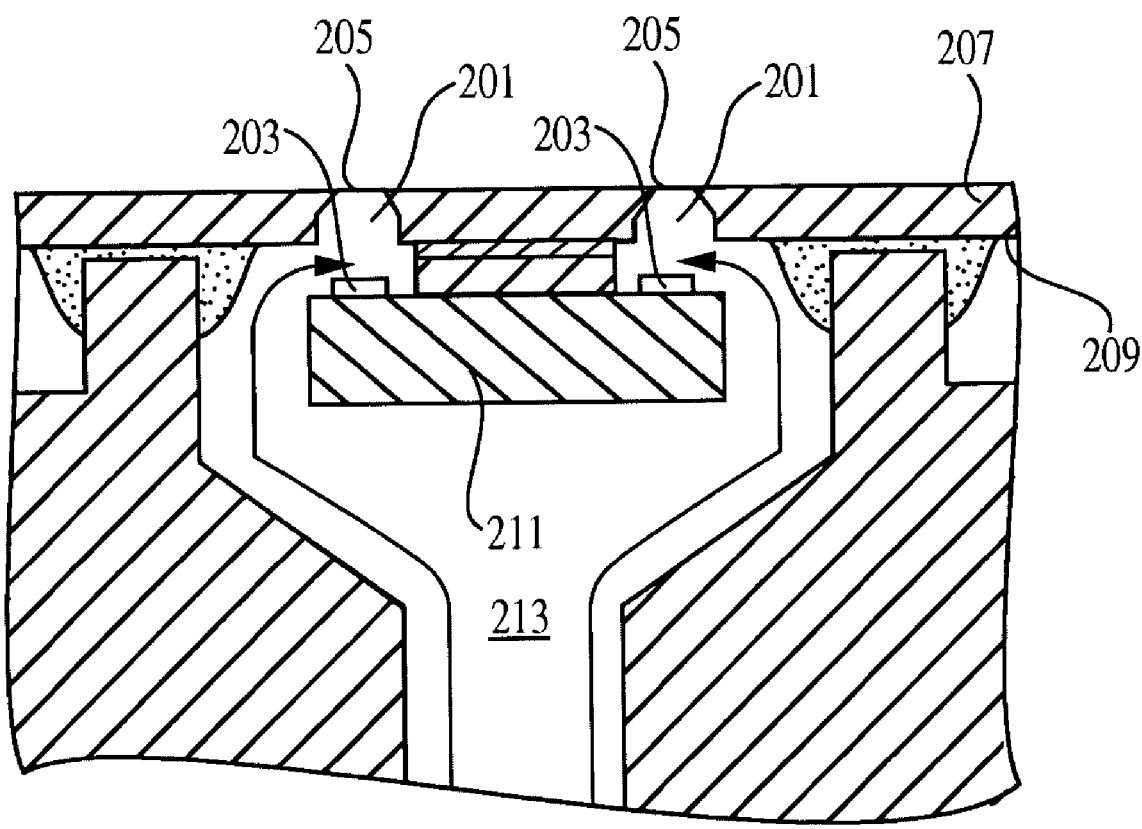
FIG. 3 is a cross-sectional view of a pair of incremental sprayers as used in the cooling system depicted in FIG. 2.

A preferred type of incremental sprayer for the sprayer head 105 is an inkjet-type sprayer. In particular, with reference to FIGS. 2 and 3, which shows two thermal sprayers (i.e., a sprayer based on ejecting fluid by a pressure wave generated through a thermal vaporization of fluid, e.g., thermal-inkjet-type sprayers), each thermal sprayer includes structure defining an ejection chamber 201 for receiving a predetermined portion of cooling fluid, and a heater 203 for vaporizing a sub-portion of the predetermined portion cooling fluid to create the pressure to eject an incremental amount of cooling fluid through an orifice 205 that directs the ejected cooling fluid toward the chip 101. The orifices are preferably formed in a flexible polymer tape 207, e.g., a polyimide tape such as is sold under the mark KAPTON.®

Affixed to a back surface 209 of the tape 207 is a silicon substrate 211 containing the heaters 203, in the form of individually energizable thin-film resistors. Each heater is preferably located on a side of the ejection chamber 201 across from the ejection chamber's orifice 205. Cooling fluid is preferably drawn and loaded into the ejection chamber by capillary action from a manifold passage 213, as is typical for an ink-jet type device. Preferably, the computerized controller 121 energizes the heater, vaporizing the portion of the cooling fluid adjacent to the heater. The vaporized cooling fluid expands, expelling most of the nonvaporized cooling fluid out of the orifice, typically in the form of one or more droplets.

Depending on the configuration of the sprayer 105, the incremental amount of the fluid sprayed from the sprayer could be in the form of a single droplet, or in the form of multiple droplets. Multiple droplets could be produced by multiple orifices related to a single heater, or by sprayers having larger ejection chambers 201 and/or appropriately shaped orifice nozzles to cause the incremental amount of fluid to break into droplets. After an ejection chamber 201 has been fired by the heater 203, capillary action again loads the ejection chamber for a subsequent firing of the chamber.

The controller 121 is mounted in a separate location on the circuit board, and is electrically connected to the heater via a plurality of contacts 123 mounted on the cap 103. The contacts, which can also deliver power to the cooling cap, are preferably integrated in the cap and exposed on its exterior. This can be done by the use of a flex circuit connection, or in the case of a ceramic cap, the electrical connections can be routed in ceramic.

Optionally, the controller could be based in the chip that is being cooled, with signals routed through the component and cap via a direct connector (not shown). Likewise, the controller could be in the cap itself. The controller could also be on a separate part of the overall apparatus (e.g., a separate portion of a computer), and might alternatively be mechanical in nature. The controller could optionally control the operation of a plurality of such cooling caps in different locations.

To form a passive capillary-action pump, the member 113 preferably forms a passageway leading from the pool 115, upward with respect of gravity, toward the manifold inlet 109 of the sprayer head 105 (and thus to the sprayer). The member is configured such that cooling fluid surface tension forces will draw the cooling fluid upward from the pool to the manifold inlet. In particular, the member preferably includes a tubular portion 131 extending from the pool 115 to the manifold inlet 109, forming the exterior of the passageway, and a porous material 133 contained within the tubular portion. The tubular portion can optionally be formed entirely within the walls of the cooling cap 103, or can alternatively extend outside the cooling cap. The upper end of the tubular portion forms the reservoir 111, receiving and retaining the sprayed cooling fluid until it feeds that retained cooling fluid to the manifold inlet of the sprayer.

The passageway formed through the pores of the porous material 133, within the tubular portion 131, is preferably characterized by a continually varying cross-section along a vertical axis. The porous material can be a sponge, sintered copper, fiber bundles, grooved metal, wire mesh, or the like. A number of potentially usable porous materials are used in the art of heat pipes.

The porous material's pore size is small enough for capillary/surface tension forces to draw the liquid cooling fluid up to the top of the tubular portion 131 and into the porous material of the reservoir 111. Preferably, the pore size is small enough to cause the cooling fluid to rise to a level 135 at least partway up the reservoir. More preferably it will fill the reservoir, placing the fluid in thermal communication with the top of the reservoir, and thus in better communication with the heat sink that tops the package. Even more preferably, the pore size is such that the surface tension forces are strong enough to raise the fluid higher, if the reservoir were extended upward. This might empower the tubular portion to draw fluid up at a higher rate of speed, allowing spray at a greater rate.

The reservoir extends above the sprayer head's manifold inlet 109, and the pore size of the porous material is also selected to be large enough to allow the sprayer head's manifolds, leading from the manifold inlet 109 to the ejection chambers 201, to draw cooling fluid from the porous material via capillary forces and/or gravity.

Optionally, part or all of the tubular portion can be vacant of porous material. In that case, that portion of the tubular portion is preferably configured with a cross sectional area such that capillary forces of the cooling fluid within the tubular portion can draw the cooling fluid upward to the porous material or the manifold inlet. In particular, porous material might not be needed in the lower portions of the tubular portion, where wider passage size may be adequate to raise the fluid for a limited distance. Alternatively, if the system contains adequate cooling fluid to assure that the pool will keep the end of the tubular portion submerged, a greater length of the tubular portion, perhaps extending all the way up to the reservoir, can be left without porous material, as the capillary forces in the porous material might syphon the cooling fluid up the lower part of the tubular portion.

Preferably this embodiment of the cooling system is designed to hold a continuing pool 115 of liquid to maintain a continuous line of liquid throughout the member 113. Preferably the entire liquid content of the reservoir is contained within the porous material 133. The pool can optionally be designed to contact portions of the internal surface, but preferably the sprayed portions do not become fully submerged. Furthermore, the member can be designed with multiple branches that contact different parts of the spray chamber, allowing the device to be used in varying orientations with respect to gravity. Indeed, the entire spray chamber (other than the thermal-transmittance wall) can be lined with porous material to aid in drawing excess fluid from around the cap regardless of its orientation.

The incremental sprayers can alternatively be based on other types of ink-jet droplet expelling technology, such as piezoelectric technology (i.e., piezoelectric nozzles). Examples of this technology are discussed in numerous U.S. Patents, including U.S. Pat. Nos. 5,924,198, 4,500,895, and 4,683,481, which are incorporated herein by reference for all purposes. Other thermal ink-jet technologies can likewise be appropriate for use for inkjet spray cooling. A highly preferable cooling fluid for use with a thermal incremental sprayer is 3M® FLUORINERT®, which is adaptable to existing thermal ink-jet technology. However, the embodiment can also be used with (preferably) distilled water, as the electronics would not be exposed to the potentially corrosive effects of the water, or to the potential conductivity if the water gained some impurities.

Figure 4:
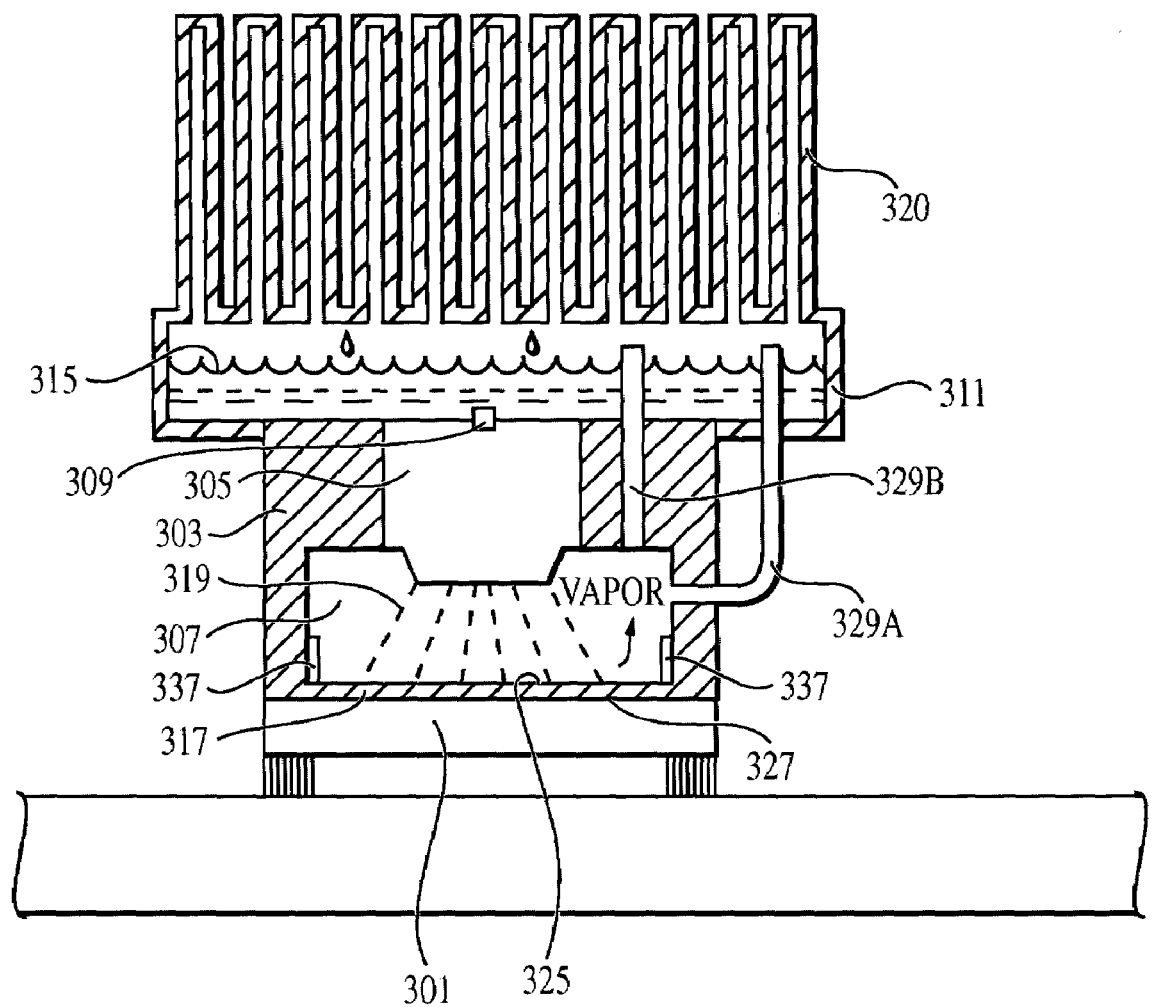
FIG. 4 is a cross-sectional, elevational view of a second embodiment of a cooling system of the invention, configured to cool a component on a printed circuit board.

With reference to FIG. 4, a second embodiment of the invention also provides for cooling a component including one or more heat-producing devices such as a chip 301 including a heat-generating semiconductor device. Similar to the first embodiment, the cooling system includes a body forming a cooling cap 303, and one or more sprayers in a sprayer head 305. The cap and sprayer head are preferably integrated into a single cooling assembly. The cap is configured to define a spray chamber 307 in which cooling fluid can be sprayed into thermal communication with the chip. The sprayer head includes a manifold inlet 309 for receiving cooling fluid in a liquid state from a reservoir 311. The reservoir is in fluid communication with, and preferably forms a single chamber that is integral with, a condenser 320.

As with the first embodiment, the chamber 307 is preferably enclosed within the cooling cap 303, and preferably forms part of a closed loop cooling system within the cooling cap. A thermal-transmittance wall 317 preferably defines the portion of the body through which cooling fluid 319 can come into thermal communication with the chip 301. The cooling fluid is sprayed directly onto an internal surface 325 of the thermal-transmittance wall, which forms a boundary of the spray chamber. An external surface 327 of the wall is preferably configured to be conformingly retained against a portion of the chip. Thus, the cooling fluid comes into thermal communication with the chip via the thermal-transmittance wall, and can absorb heat and vaporize due to the heat dissipated by the chip.

As before, the thermal-transmittance wall 317 is composed of a material and constructed with a preferably thin thickness such that it provides little thermal resistance for heat dissipated by the chip 301 into the cooling cap 303. Optionally, a thermal connector, such as an interface material of gap-filling thermal foam or other thermally conductive material, can be placed between the thermal-transmittance wall and the chip when then are retained together, thus providing a more thermally conductive interface between the chip and the cooling fluid within the cooling cap.

The cooling fluid vapor is directed or fed to the condenser 320, through one or more vapor pipes configured for carrying vapor. In particular, a vapor pipe can be formed from an external structure 329A that forms a preferably unobstructed passageway from the spray chamber to the condenser, or from internal structure 329B of the cooling cap that forms a preferably unobstructed passageway from the spray chamber to the condenser. The vaporized cooling fluid flows to the condenser via gravity (i.e., buoyancy), and/or via vapor static pressure that builds up in the spray chamber. If the reservoir and condenser are formed integrally (as shown), the pipe preferably opens into the condenser at a level above a fluid level 315 in the reservoir (with respect to gravity). Alternatively, a one-way valve can be installed on the end of the pipe.

Preferably a controller (not shown), as described in the first embodiment, controls the spray rate of the sprayers such that the heat to vaporize the sprayed cooling fluid is equal to the heat to be dissipated by the chip. In such a case, substantially all the cooling fluid will be vaporized.

The embodiment further includes one or more thin film resistive heaters 337 (drawn significantly oversized in FIG. 4 for ease of viewing), such as a KAPTON (™) patch heater of the type made by MINCO®. These heaters are preferably positioned on each interior wall of the spray chamber. Additionally, a temperature sensor is preferably located on each interior wall of the spray chamber. Under the control of the controller, and guided by readings from the temperature sensors, the heaters could be energized to heat each wall of the spray chamber such that it is maintained at a prescribed temperature. Preferably the prescribed temperature is near the boiling point of the cooling fluid associated with the pressure within the spray chamber. As a result, the heaters and temperature sensors would avoid significant condensation on the walls of the spray chamber.

The heaters 337 can also be used to vaporize any residual fluid not vaporized by the heat of the component. Additionally, the heaters can be used to pump all fluid up to the reservoir after the component is powered down (i.e., not producing significant heat). Optionally, only heaters in the gravitational bottom of the spray chamber could be energized, vaporizing pooled cooling fluid.

The heaters and temperature sensors operate as a pump to pump cooling fluid up to the reservoir. Alternative forms of pumps can also be used to pump excess liquid cooling fluid up to the reservoir 311. A preferred alternative pump is a passive, capillary-action pump (i.e., a device that moves fluid upward through capillary forces) as described above, rather than an active mechanical pump that can suffer from mechanical reliability problems. This is further described in the third embodiment, below. As in the first embodiment, preferably, the sprayer head 305 includes incremental sprayers, and more preferably, incremental thermal sprayers.

The condenser 320 can be any of a variety of designs using various heat sink technology. Vapor condensed in the condenser flows via gravity to join the liquid in the reservoir 311. The reservoir is preferably located above the sprayer head, such that gravity (and/or capillary forces) will draw the liquid into the sprayer manifold 309 from the reservoir to service the spray nozzles. A passive thermosyphon pump is thus created that does not require an active pump to move cooling fluid through the closed loop system.

Figure 5:
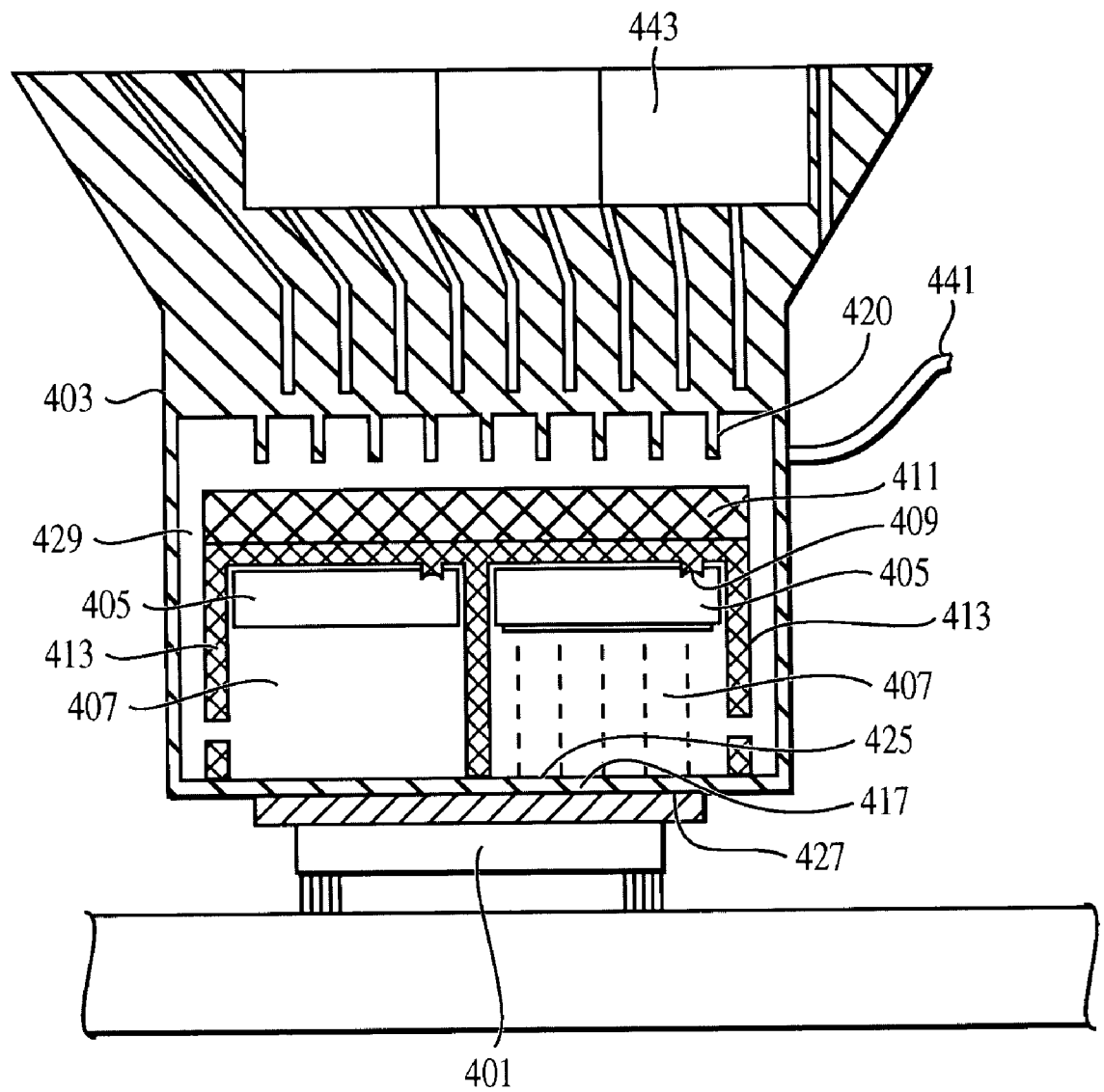
FIG. 5 is a cross-sectional, elevational view of a third embodiment of a cooling system of the invention, configured to cool a component on a printed circuit board.

With reference to FIG. 5, a third embodiment of a cooling system provides for cooling a component including one or more heat-producing devices such as a chip 401 including a heat-generating semiconductor device. The third embodiment combines features of the first two embodiments. The comments above should be understood to apply to the third embodiment where appropriate, and the comments below should be understood to apply to the first and/or second embodiment where applicable.

The cooling system includes a body forming a cooling cap 403, and at least one sprayer (or more preferably a plurality of sprayers) in each of two sprayer heads 405. One sprayer head, or three or more sprayer heads are also envisioned within the scope of the invention. The cap and sprayer heads are preferably integrated into a single cooling assembly. The cap is configured to form one or more a spray chambers 407 in which cooling fluid can be sprayed into thermal communication with the chip 401. The sprayer heads each include manifold inlets 409 for receiving cooling fluid in a liquid state from a reservoir 411.

More particularly, each chamber 407 is preferably enclosed within the cooling cap 403, and preferably forms part of a closed loop cooling system within the cooling cap. A thermal-transmittance wall 417 preferably defines the portion of the body through which cooling fluid can come into thermal communication with the chip 401. The cooling fluid is sprayed directly onto an internal surface 425 of the thermal-transmittance wall (i.e., a surface that forms a boundary of the spray chamber). An external surface 427 of the wall is preferably configured to be conformingly retained against a portion of the chip (i.e., the semiconductor device or its cover). Thus, the cooling fluid comes into thermal communication with the chip via the thermal-transmittance wall, and can absorb heat and possibly vaporize due to the heat dissipated by the chip.

The heated cooling fluid can vaporize and recondense, or pool in the gravitational bottom of the chamber, which might be at least partially coincident with the thermal-transmittance wall. One or more members, and more preferably a large, multisurface member 413, extends from the sprayer heads 405 down to the bottom of the spray chamber 407 with respect to gravity. The member is configured as a passive, capillary-action pump to pump any liquid cooling fluid that has formed a pool in the spray chamber upward to the sprayer head. The member may include a containment portion and a porous material contained within the tubular portion, or it can simply be made of a porous material. The member can optionally cover some or all of the surfaces in the spray chamber, other than the internal surface 425 of the thermal-transmittance wall.

As in the first embodiment, the porous material's pore size is small enough to draw the liquid cooling fluid up the containment portion and into a porous material in the reservoir 411. Preferably, the pore size is small enough to cause the cooling fluid to rise to a level partway up the reservoir, but large enough so that it either does not reach the top of porous material, or it only barely reaches the top. The reservoir extends above the sprayer head's manifold inlet 409, and the pore size of the porous material is also selected to be large enough to allow the sprayer head's manifolds, leading from the manifold inlet to the ejection chambers, to draw cooling fluid from the porous material via capillary forces and/or gravity.

Cooling fluid vapor that does not recondense within the spray chamber 407 is directed or fed to a condenser 420, through structure 429 forming one or more internal or external vapor pipes that define a relatively unobstructed passageway for carrying vapor from the spray chamber to the condenser. The vaporized cooling fluid flows to the condenser via gravity (i.e., hot gas rising), and/or via vapor static pressure that builds up in the spray chamber. The reservoir and condenser are configured such that cooling fluid that condenses in the condenser flows (e.g., drips) into the reservoir, and most preferably into the porous material of the capillary pump.

Preferably, the sprayer head's sprayers are incremental sprayers configured to eject an incremental amount of cooling fluid onto the internal surface of the thermal-transmittance wall. A preferred type of incremental sprayer is a thermal sprayer.

A computerized controller (not shown) is electrically connected to the cap 403 via a power and signal cable 441 attached to the cap. As noted in the first embodiment, numerous other options exist for the location and form of the controller. Heaters, as described with reference to the second embodiment, can also be incorporated into the third embodiment.

For the cooling system to function at optimal efficiency, the sprayers' mass flow rate ($\dot{m}_s$) is preferably adjusted to avoid having the internal surface become either dry or immersed. However, as described above, under some embodiments of the present invention excess spray can be efficiently removed from the spray chamber.

Heat sinks used in the above-described condensers can be any of a wide number of known types, such as air cooled, liquid cooled, refrigerated, and the like. As depicted in FIG. 5, one preferred type is a vaned heat sink having a fan 443 configured to increase airflow across the vanes.

Alternate variations of the embodiments could comprise other types of incremental spraying mechanisms, such as piezoelectric sprayers, or other spraying mechanisms including nonincremental sprayers. In short, the above disclosed features can be combined in a variety of configurations within the anticipated scope of the invention. Furthermore, embodiments of the invention can incorporate various combinations of the spray cooling apparatus described in U.S. Pat. No. 6,205,799, which is incorporated herein by reference for all purposes.

Generally speaking, many embodiments of the invention can be configured to be pressed onto a component, such as the ones depicted in FIGS. 2, 4 and 5. The component could be a typical chip that includes a cover, or an uncovered semiconductor device. The component could also be other types of electronics, optical devices (e.g., lasers), electro-mechanical devices, or other such heat-producing devices. Using various means of attachment, such as using clamps or adhesives, are within the scope of the invention.

Many embodiments are orientation independent, and/or can be configured for components situated in any given orientation. In particular, the capillary force pumps can generally operate at any orientation, and can be configured to contact pooled cooling fluid in any portion of the cooling device. Likewise, the passive vapor recovery system will generally operate at most any orientation, and the heat exchanger can be configured to deliver liquid cooling fluid either directly to the reservoir, or to any functional portion of a capillary pump.

As an alternative to the cooling system being configured with an integral pump, reservoirs and/or heat exchangers, external versions of combinations of one or more of these devices are envisioned within the scope of the invention. Additionally, these external devices can be shared by a plurality of individual cooling systems.

It is to be understood that the invention comprises apparatus and methods for designing cooling systems and for producing cooling systems, and the apparatus and methods of the cooling system itself. Additionally, the various embodiments of the invention can incorporate various combinations of the features disclosed above in generally discussing an inkjet spray cooling system, and can be designed, made and operated using related methods (or portions thereof) as described above for the inkjet spray cooling system.

Each cooling cap can be used with a component of comparable size, or with a plurality of components that conform to the external surface of the thermal-transmittance wall. In some cases, a thermal interface material can be used to accommodate multiple components of slightly different heights. Likewise, multiple cooling caps can be used on a large component.

Furthermore, it is to be understood that cooled components, cooled singly or in groups as described above, can be mounted on circuit boards to form cooled systems, including one or more cooled circuit boards carrying one or more cooled components that are electronically interlinked via the circuit boards. Such cooled systems are also within the scope of the invention. Additionally, groups of the cooled components that are combined by using with one or more common external cooling fluid condensers are also within the scope of the invention.

Likewise, a related method for cooling a component with a sprayed cooling fluid, under the present invention, can include the steps of adjoining an external surface of an above-described cooling cap against a portion of the component, and spraying cooling fluid onto the internal surface of the thermal-transmittance wall. The step of spraying can include the step of signaling a sprayer to eject incremental amounts of cooling fluid onto the internal surface of the thermal-transmittance wall at a given frequency. Other aspects of the method are apparent in the making and use of the above-described cooling systems.

While particular forms of the invention have been illustrated and described, it will be apparent that various modifications can be made without departing from the spirit and scope of the invention. Thus, although the invention has been described in detail with reference only to the preferred embodiments, those having ordinary skill in the art will appreciate that various modifications can be made without departing from the scope of the invention. Accordingly, the invention is not intended to be limited by the above discussion, and is defined with reference to the following claims.

We claim:

1. A system for cooling a component with a sprayed cooling fluid, comprising:
   a body defining an enclosed spray chamber and a thermal-transmittance wall, wherein the wall defines an internal surface forming a boundary of the spray chamber, and wherein the wall defines an external surface configured to be retained against a portion of the component; and
   a sprayer configured to spray the cooling fluid onto the internal surface.

2. The system of claim 1, wherein the sprayer is configured to eject incremental amounts of cooling fluid onto the wall in response to a control signal.

3. The system of claim 2, wherein the sprayer is a thermal sprayer.

4. The system of claim 2, and further comprising a controller configured to transmit a control signal to the sprayer such that the sprayer ejects incremental amounts of cooling fluid at a rate leading to the cooling fluid being vaporized by heat dissipated from the component.

5. The system of claim 1, wherein the body further defines a reservoir configured to receive the sprayed cooling fluid from the internal surface, and configured to feed the received cooling fluid to an inlet of the sprayer.

6. The system of claim 1, wherein the body further defines a condenser configured to remove heat from cooling fluid vaporized by heat dissipated from the component.

7. The system of claim 6, and further comprising a pump configured to pump cooling fluid from the spray chamber.

8. The system of claim 7, wherein the pump comprises:
a member defining one or more cavities forming a porous passageway extending upward with respect to gravity, toward the sprayer;
wherein the porous passageway is configured such that cooling fluid surface-tension forces will draw the cooling fluid upward toward the sprayer.

9. The system of claim 7, wherein the pump comprises a means for drawing cooling fluid upward toward the sprayer under the effect of surface-tension forces.

10. The system of claim 7, wherein the pump comprises a heater configured to heat a surface of the spray chamber.

11. The system of claim 6, and further comprising an apparatus for cooling and transferring vaporized cooling fluid from the spray chamber to the sprayer, comprising:
a condenser configured to receive and cool vaporized cooling fluid;
a reservoir in fluid communication with the condenser such that vaporized cooling fluid that is condensed by the condenser passes into the reservoir, wherein the reservoir is configured to feed liquid cooling fluid to the sprayer; and
a structure defining an open passageway extending from the spray chamber to the condenser.

12. The system of claim 11, and further comprising a heater configured to heat a surface of the spray chamber.

13. The system of claim 11, and further comprising:
a heater configured to heat a surface of the spray chamber;
a temperature sensor configured to sense the temperature of the surface of the spray chamber; and
a controller configured to energize the heater in response to the sensed temperature so as to heat the surface to a predetermined temperature.

14. The system of claim 1, and further comprising:
a thermal-inkjet-type head incorporating the sprayer, wherein the sprayer is configured to eject incremental amounts of the cooling fluid through the spray chamber and onto the wall; and
a pump configured to pump cooling fluid from the spray chamber to a reservoir defined by the body, the reservoir being configured with an outlet to feed cooling fluid to the thermal-inkjet-type head;
wherein the body further defines a condenser configured to remove heat from cooling fluid that was heated by the component.

15. The system of claim 14, wherein the condenser is integral with the reservoir.

16. The system of claim 14, wherein the pump is configured to pump liquid cooling fluid.

17. The system of claim 14, wherein the body is an integral unit.

18. The system of claim 1, wherein the chamber is at least partially evacuated of extraneous gasses.

19. A cooled component, comprising:
a semiconductor device;
a substrate carrying the semiconductor device;
a body defining a spray chamber;
a thermal-transmittance wall, wherein the wall defines an internal surface forming a boundary of the spray chamber, and wherein the wall defines an external surface adjoining a portion of the semiconductor device;
a cooling fluid; and
a sprayer configured to spray the cooling fluid onto the internal surface.

20. The cooled component of claim 19, wherein the sprayer is configured to eject incremental amounts of cooling fluid into thermal communication with the semiconductor device in response to a control signal.

21. The cooled component of claim 20, wherein the sprayer is incorporated in a thermal-inkjet-type head.

22. The cooled component of claim 20, and further comprising a controller configured to transmit a control signal to the sprayer such that the sprayer ejects cooling fluid at a rate appropriate for vaporizing the cooling fluid while providing adequate cooling to the semiconductor device.

23. The cooled component of claim 19, wherein the body defines a reservoir configured to receive the sprayed cooling fluid from the internal surface, and configured to feed cooling fluid to an inlet of the sprayer.

24. The cooled component of claim 19, wherein the body defines a condenser configured to remove heat from cooling fluid vaporized by heat from the semiconductor device.

25. The cooled component of claim 24, and further comprising a pump configured to pump cooling fluid from the spray chamber.

26. The cooled component of claim 19, and further comprising:
a thermal-inkjet-type head incorporating the sprayer; and
a pump configured to pump cooling fluid from the spray chamber to a condenser defined by the body, the condenser being configured to remove heat from cooling fluid vaporized by heat from the semiconductor device;
wherein the body further defines a reservoir configured to receive the sprayed cooling fluid, and configured to feed cooling fluid to an inlet of the sprayer.

27. A circuit board system, comprising
a circuit board; and
a plurality of cooled components as recited in claim 19, each cooled component being mounted on the circuit board.

28. The system of claim 27, each cooled component further comprising:
a pump configured to pump cooling fluid from the internal surface to a condenser defined by the body of the cooled component, the condenser being configured to remove heat from cooling fluid vaporized by heat from the semiconductor device of the cooled component;
wherein the sprayer of each cooled component is a thermal sprayer configured to eject incremental amounts of cooling fluid onto the semiconductor; and
wherein the body of each cooled component defines a reservoir configured to receive cooling fluid from the internal surface, and further configured to feed cooling fluid to an inlet of the sprayer of each cooled component.

29. A circuit board system, comprising:
a plurality of circuit boards; and
a plurality of the cooled components of claim 19, the plurality of cooled components being mounted on the plurality of circuit boards;
wherein the plurality of cooled components is electrically interconnected via the plurality of circuit boards.

30. The circuit board system of claim 29, each cooled component further comprising:
a pump configured to pump cooling fluid from the internal surface to a condenser defined by the body, the condenser being configured to remove heat from cooling fluid vaporized by heat from the semiconductor device;

wherein the sprayer of each cooled component is a thermal sprayer configured to eject incremental amounts of cooling fluid onto the semiconductor; and wherein the body of each cooled component defines a reservoir configured to receive cooling fluid from the internal surface, and further configured to feed cooling fluid to an inlet of the sprayer of each cooled component.

31. A method for cooling a component with a sprayed cooling fluid, comprising:

adjoining an external surface of a body against a portion of the component, the body defining an enclosed spray chamber and a thermal-transmittance wall, wherein the wall defines an internal surface forming a boundary of the spray chamber, and wherein the wall defines the external surface that is retained against the portion of the component; and spraying cooling fluid onto the internal surface of the wall.

32. The method of claim 31, wherein the step of spraying comprises:

signaling a sprayer to eject incremental amounts of cooling fluid onto the internal surface of the wall at a given frequency.

33. The method of claim 32, wherein:

the sprayer comprises a body defining an ejection chamber configured to hold a volume of the cooling fluid, the body further defining an orifice in communication with the ejection chamber, and the sprayer further comprises a heating element in thermal communication with the ejection chamber, the heating element being configured to vaporize a portion of the cooling fluid held within the ejection chamber, and the orifice being configured to direct cooling fluid from the ejection chamber to the heat source upon the heating element vaporizing a portion of the cooling fluid held within the ejection chamber; and in the step of spraying, the heating element vaporizes a portion of the cooling fluid held within the ejection chamber in response to the sprayer being signaled, thereby causing cooling fluid to be directed from the ejection chamber to the semiconductor device.

34. The method of claim 31, wherein the body defines a reservoir configured to receive cooling fluid sprayed on the internal surface, and configured to feed the sprayed cooling fluid to a sprayer that is used in the step of spraying, and further comprising pumping the cooling fluid such that it flows from the spray chamber to the reservoir.

* * * * *